(12) United States Patent
Oboukhov et al.

(10) Patent No.: US 10,417,089 B2
(45) Date of Patent: Sep. 17, 2019

(54) DATA STORAGE DEVICE EXTENDING ERASURES FOR LDPC-TYPE DECODING

(71) Applicant: Western Digital Technologies, Inc., Irvine, CA (US)

(72) Inventors: Iouri Oboukhov, Rochester, MN (US); Weldon M. Hanson, Rochester, MN (US); Niranjay Ravindran, Rochester, MN (US); Richard L. Galbraith, Rochester, MN (US)

(73) Assignee: Western Digital Technologies, Inc., San Jose, CA (US)

( * ) Notice: Subject to any disclaimer, the term of this patent is extended or adjusted under 35 U.S.C. 154(b) by 103 days.

(21) Appl. No.: 15/895,921

(22) Filed: Feb. 13, 2018

(65) Prior Publication Data

US 2019/0250987 A1 Aug. 15, 2019

(51) Int. Cl.
*G06F 11/10* (2006.01)
*H03M 13/11* (2006.01)
(Continued)

(52) U.S. Cl.
CPC .......... *G06F 11/1072* (2013.01); *G06F 3/064* (2013.01); *G06F 3/0619* (2013.01);
(Continued)

(58) Field of Classification Search
CPC .... G06F 11/1072; G06F 3/0619; G06F 3/064; G06F 3/0679; G06F 3/0688;
(Continued)

(56) References Cited

U.S. PATENT DOCUMENTS 4,683,572 A * 7/1987 Baggen ............. G11B 20/1809
714/756
5,996,110 A * 11/1999 Kosmach .......... H03M 13/1515
714/759
(Continued)

OTHER PUBLICATIONS

Gunnam1, et al., Next Generation Iterative LDPC Solutions for Magnetic Recording Storage, 2008, IEEE, pp. 1148-1152. (Year: 2008).*

(Continued)

*Primary Examiner* — John J Tabone, Jr.

(57) ABSTRACT

A data storage device is disclosed comprising a non-volatile storage medium (NVSM). A reliability metric for each symbol of each of a plurality of codewords read from the NVSM is generated, and a number of erasures for a first codeword are generated, wherein the number of erasures exceeds the correction power of the first codeword. A reliability metric of the first codeword is modified corresponding to one of the erasures. The reliability metrics for each codeword including the modified reliability metrics of the first codeword are first iteratively processed using a low density parity check (LDPC) type decoder, thereby first updating the reliability metric for each symbol of each codeword. The reliability metrics for the first codeword are second updated using the parity sector, and the second updated reliability metrics for the first codeword are second iteratively processed using the LDPC-type decoder.

21 Claims, 4 Drawing Sheets

(51) Int. Cl.
    *H03M 13/27*     (2006.01)
    *G06F 3/06*     (2006.01)
    *G11C 29/52*     (2006.01)
    *H03M 13/39*     (2006.01)
    *H03M 13/25*     (2006.01)

(52) U.S. Cl.
    CPC .......... *G06F 3/0679* (2013.01); *G06F 3/0688* (2013.01); *G06F 3/0689* (2013.01); *G11C 29/52* (2013.01); *H03M 13/1102* (2013.01); *H03M 13/1105* (2013.01); *H03M 13/255* (2013.01); *H03M 13/27* (2013.01); *H03M 13/3927* (2013.01)

(58) Field of Classification Search
    CPC .. G06F 3/0689; G11C 29/52; H03M 13/1105; H03M 13/27; H03M 13/3927; H03M 13/1102; H03M 13/255
    USPC ........ 714/773, 752, 763, 768–770, 780, 800
    See application file for complete search history.

(56) References Cited

U.S. PATENT DOCUMENTS

| | | | |
|---|---|---|---|
| 6,047,395 A | 4/2000 | Zook | |
| 6,694,477 B1* | 2/2004 | Lee | H03M 13/03 714/755 |
| 7,340,665 B2 | 3/2008 | Tsang | |
| 7,900,125 B1* | 3/2011 | Liu | G06F 11/1048 714/760 |
| 8,448,039 B2 | 5/2013 | Gunnam | |
| 8,745,466 B2* | 6/2014 | Kaynak | G11B 20/10277 714/763 |
| 8,769,380 B1* | 7/2014 | Burd | H03M 13/1128 714/774 |
| 9,059,737 B2 | 6/2015 | Coker et al. | |
| 9,160,373 B1* | 10/2015 | Varnica | H03M 13/2909 |
| 9,214,964 B1* | 12/2015 | Varnica | H03M 13/2909 |
| 9,412,410 B1 | 8/2016 | Bentley et al. | |
| 9,490,849 B1* | 11/2016 | Varnica | H03M 13/2909 |
| 9,632,863 B2 | 4/2017 | Galbraith et al. | |
| 9,761,273 B1* | 9/2017 | Chen | G11B 20/1833 |
| 9,785,504 B2 | 10/2017 | Wu et al. | |
| 10,056,920 B1* | 8/2018 | Chen | H03M 13/2906 |
| 10,063,257 B1* | 8/2018 | Chen | H03M 13/1111 |
| 2005/0108616 A1* | 5/2005 | Hekstra | H03M 13/37 714/781 |
| 2009/0249158 A1* | 10/2009 | Noh | H04L 1/0026 714/750 |
| 2012/0030541 A1* | 2/2012 | Okamura | H03M 13/1117 714/758 |
| 2012/0036395 A1* | 2/2012 | Kaynak | G11B 20/10277 714/15 |
| 2012/0036414 A1* | 2/2012 | Kaynak | G11B 20/10009 714/777 |
| 2012/0054585 A1* | 3/2012 | Jiang | H03M 13/1111 714/777 |
| 2013/0332794 A1* | 12/2013 | Yen | G11B 20/10527 714/758 |
| 2014/0310580 A1* | 10/2014 | Zhang | H03M 13/1111 714/780 |
| 2015/0092886 A1* | 4/2015 | Ionita | H04L 25/4917 375/298 |
| 2017/0300380 A1* | 10/2017 | Lei | G06F 11/1068 |
| 2017/0324430 A1 | 11/2017 | Han et al. | |
| 2018/0270018 A1* | 9/2018 | Mushkin | H03M 13/2906 |

OTHER PUBLICATIONS

Tomlinson et al. Extending the Dorsch decoder towards achieving maximum-likelihood decoding for linear codes, 2007, IET, pp. 479-488. (Year: 2007).*

R. Lynch, E. Kurtas, A. Kuznetsov, E. Yeo, B. Nikolic "The Search for a Practical Iterative Detector for Magnetic Recording," IEEE Transactions on Magnetics, vol. 40, No. 1, Jan. 2004.

* cited by examiner

DATA STORAGE DEVICE EXTENDING ERASURES FOR LDPC-TYPE DECODING

BACKGROUND

Data storage devices such as disk drives, tape drives, and solid state drives typically employ some form of error correction code (ECC) capable of correcting errors when reading the recorded data from the storage medium, thereby compensating for signal noise that is inherent with every recording/reproduction channel. During a write operation, redundancy symbols are generated and appended to user data which are then processed during a corresponding read operation in order to detect and correct errors in the user data. The number of errors that can be corrected increases as the number of redundancy symbols increases, but increasing the redundancy symbols also decreases the capacity of the storage medium. For example, with a Reed Solomon code employing N redundancy symbols, up to N symbols in error may be detected in a codeword, and up to N/2 symbols may be corrected. When the location of the erroneous symbols within a codeword are known (referred to as erasures), a Reed Solomon code is capable if correcting up to N symbols in error. That is, erasures assist the decoding of a Reed Solomon codeword as long as the number of erasures does not exceed the number of redundancy symbols in the codeword. If the number of erasures exceeds the correction power of the ECC, the codeword will fail to decode. This is true for essentially every ECC system, including an iterative ECC system such as a low density parity check (LDPC) code.

Figure 1A:
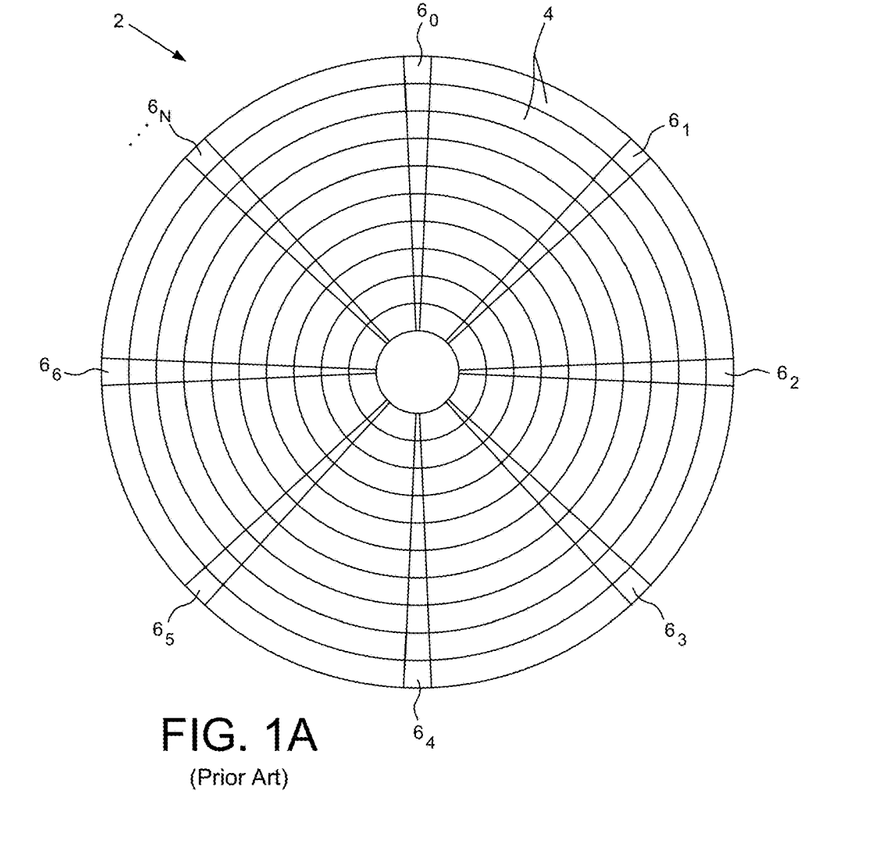
FIG. 1A shows a prior art disk format comprising a plurality of servo tracks defined by servo sectors.
Figure 1B:
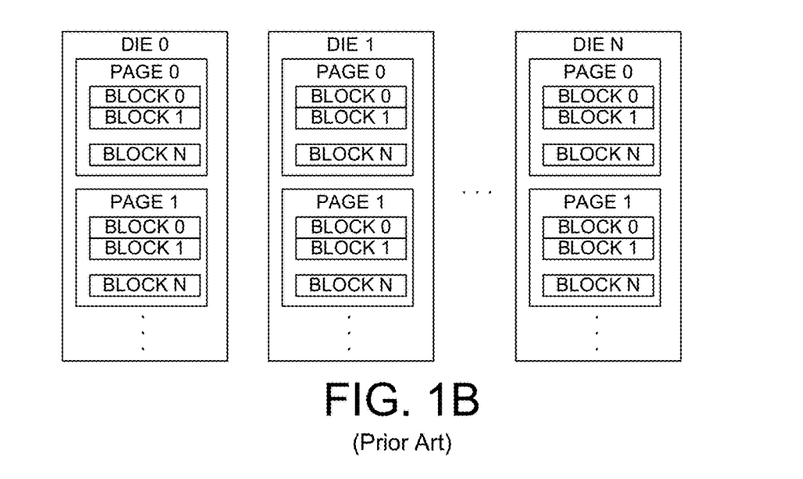
FIG. 1B shows a prior art solid state drive format comprising a plurality of dies each comprising a plurality of pages.

FIG. 1A shows a prior art disk format 2 as comprising a number of servo tracks 4 defined by servo sectors $6_0$-$6_N$ recorded around the circumference of each servo track. Data tracks are defined relative to the servo tracks at the same or different radial density, wherein each data track comprises a plurality of data sectors. Each data sector may store the symbols of a single codeword, or in other embodiments, each data sector may store symbols from multiple codewords (i.e., interleaved codewords). FIG. 1B shows a prior art die format for a solid state drive, wherein each die may store multiple pages and each page may store multiple blocks each corresponding to a data sector of a disk drive.

DETAILED DESCRIPTION

Figures 2A, 2B:
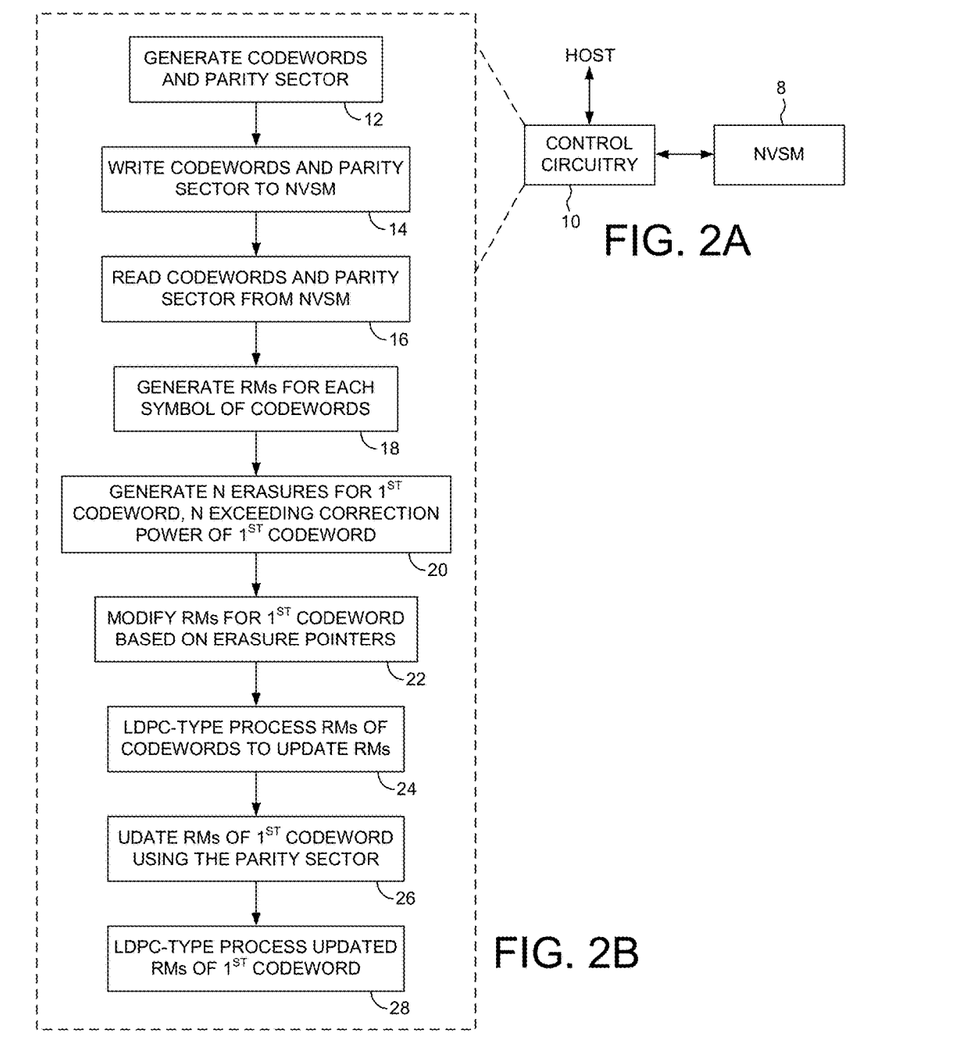
FIG. 2A shows a data storage device according to an embodiment comprising control circuitry and a non-volatile storage medium (NVSM).
FIG. 2B is a flow diagram according to an embodiment wherein a number of erasures is generated for a codeword that exceeds the correction power of the codeword, wherein the codeword is recovered using a parity sector.

FIG. 2A shows a data storage device according to an embodiment comprising a non-volatile storage medium (NVSM) 8, and control circuitry 10 configured to execute the flow diagram of FIG. 2B. The data storage device may include one or more types of NVSM, including rotating magnetic media (e.g., a hard disk drive), magnetic tape media (e.g., tape drive), and solid state memory (e.g., a solid state drive). While the description herein refers to solid state memory generally, it is understood that solid state memory may comprise one or more of various types of memory devices such as flash integrated circuits, Chalcogenide RAM (C-RAM), Phase Change Memory (PC-RAM or PRAM), Programmable Metallization Cell RAM (PMC-RAM or PMCm), Ovonic Unified Memory (OUM), Resistive RAM (RRAM), NAND memory (e.g., Single-Level Cell (SLC) memory, Multi-Level Cell (MLC) memory, TLC, QLC, etc., or any combination thereof), NOR memory, EEPROM, Ferroelectric Memory (FeRAM), Magneto-resistive RAM (MRAM), other discrete NVM chips, or any combination thereof. A plurality of codewords each comprising a plurality of symbols are generated, and a parity sector is generated over the plurality of codewords (block 12). The plurality of codewords and the parity sector are written to the NVSM (block 14), and the plurality of codewords and the parity sector are read from the NVSM (block 16). A reliability metric for each symbol of each codeword read from the NVSM is generated (block 18), and a number of erasures for a first codeword read from the NVSM are generated (block 20), wherein the number of erasures exceeds the correction power of the first codeword. A reliability metric of the first codeword is modified corresponding to one of the erasures (block 22). The reliability metrics for each codeword including the modified reliability metrics of the first codeword are first iteratively processed using a low density parity check (LDPC) type decoder (block 24), thereby first updating the reliability metric for each symbol of each codeword. The reliability metrics for the first codeword are second updated using the parity sector (block 26), and the second updated reliability metrics for the first codeword are second iteratively processed using the LDPC type decoder (block 28).

Figure 3:
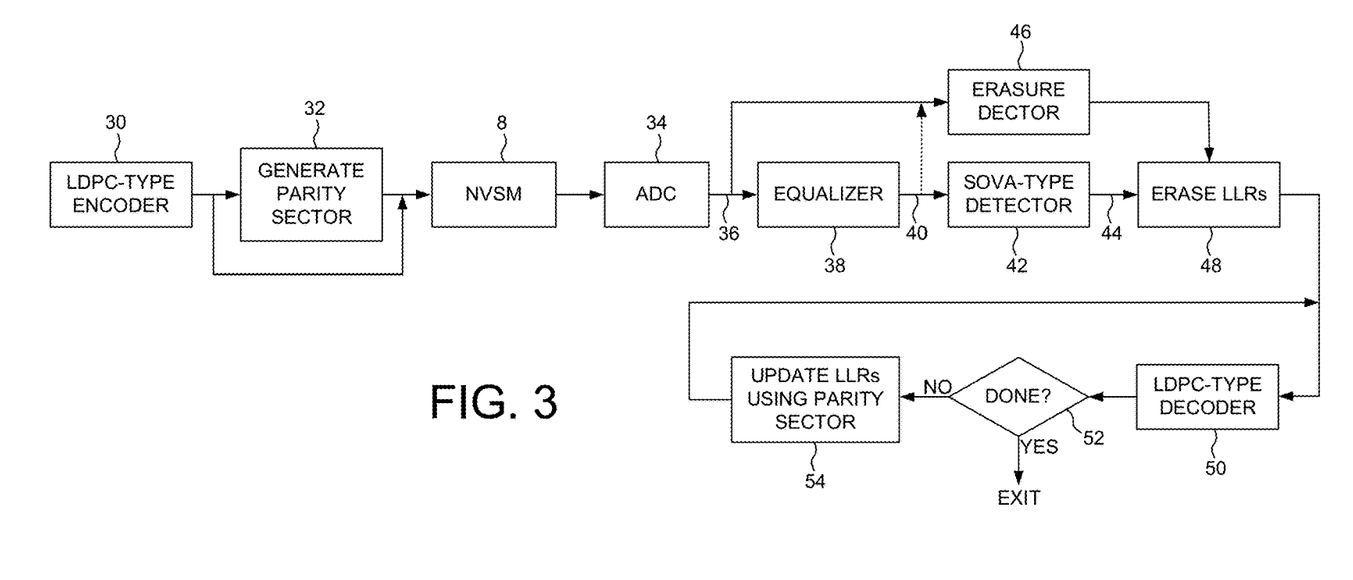
FIG. 3 shows control circuitry according to an embodiment comprising a soft-output Viterbi algorithm (SOVA) detector, a LDPC decoder, and a block for updating the reliability metrics (log-likelihood ratios (LLRs)) for at least one codeword using a parity sector.

FIG. 3 shows control circuitry according to an embodiment wherein an LDPC-type encoder 30 encodes data into a plurality of codewords. A parity sector is generated (block 32), for example, by XORing the corresponding bits of each codeword. The codewords and the parity sector are written to the NVSM 8. During a read operation, the codewords and the parity sector are read from the NVSM to generate a read signal, and an analog-to-digital converter (ADC) samples the read signal to generate read signal samples 36. The read signal samples 36 are equalized according to a target partial response (block 38) to generate equalized samples 40. A SOVA-type detector 42 processes the equalized samples 40 to generate a reliability metric 44 (in this embodiment an LLR) for each symbol of a corresponding codeword. The read signal samples 36 (and/or the equalized samples 40) are processed to generate a number of erasures (block 46) each corresponding to a marginal symbol of a codeword. The LLR for each marginal symbol identified by the erasures is modified (block 48), for example, by zeroing the LLR to indicate a neutral likelihood for the symbol. The LLRs of each codeword, including the modified LLRs identified by the erasures, are iteratively processed using an LDPC-type decoder 50. If the LDPC-type decoding fails due to at least one of the codewords failing to converge (block 52), the LLRs for at least one of the un-converged codewords are updated based on the parity sector (block 54), and the updated LLRs are processed again by the LDPC-type decoder 50. The process of updating the LLRs of an un-converged codeword using the parity sector at block 54 and reprocessing the updated LLRs by the LDPC-type decoder 50 may be repeated a number of times until all of the codewords converge.

Any suitable technique may be employed to generate the erasures at block 46 of FIG. 3, for example, based on a quality of the read signal. In one embodiment, a degradation in the signal-to-noise ratio may be detected in either or both of the read signal samples 36 and the equalized samples 40. In another embodiment, a misequalization amplitude in the equalized samples 40 may indicate a low signal quality and therefore trigger an erasure. In one embodiment, when an erasure is generated for a particular symbol, a predetermined number of adjacent symbols may also be erased due to a high likelihood an anomaly adversely affects adjacent symbols. For example, a reduction in SNR due to a defect in the NVSM (or track squeeze of tracks on a disk) is likely to affect a number of adjacent symbols, and therefore a predetermined consecutive sequence of symbols may be erased when an anomaly is detected. In another example, noise in a read signal sample may propagate to adjacent (following) symbols due to equalizing the read signal samples.

Figure 4A:
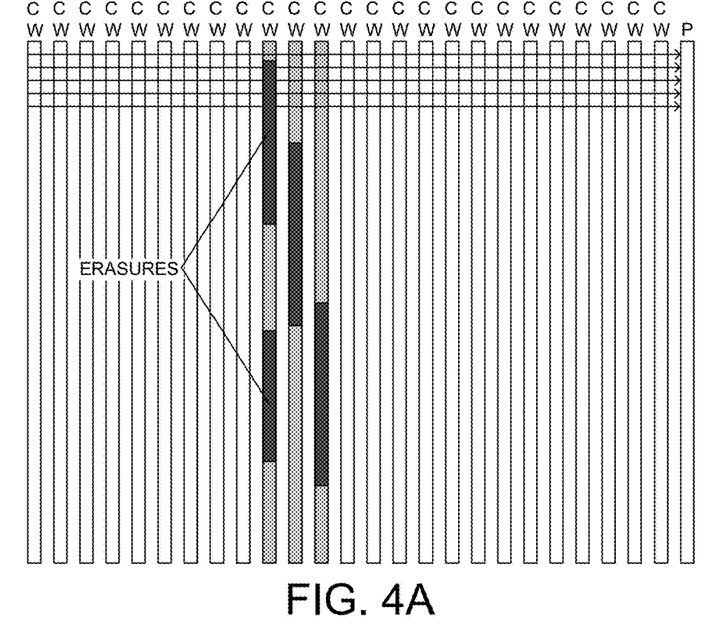
FIG. 4A shows an embodiment wherein a physical block of the NVSM stores a codeword that may be corrupted, for example, by a track squeeze condition.

FIG. 4A shows an example format of vertical codewords (CW) that are encoded, for example, by the LDPC-type encoder 30 of FIG. 3. Each codeword comprises a number of data symbols and a number of redundancy symbols (e.g., parity) used to correct errors when the codeword is read from the NVSM 8. A parity sector (P) is generated by XORing the bits of the corresponding codewords, wherein the parity sector is processed to update the LLRs of at least one codeword that failed to converge during the LDPC decoding. In one embodiment, errors in the codewords tend to occur anisotropically along the length of a few codewords (as opposed to distributed randomly across the codewords) due to the failure characteristics of the NVSM 8. For example, when the NVSM 8 is a disk of a disk drive, a track squeeze condition tends to affect a number of consecutive data sectors along the length of the track. Accordingly as shown in the example of FIG. 4A, a track squeeze condition may result in a number of consecutive codewords having marginal signal quality (represented by grey sections) that will prevent the codeword from converging during the initial processing by the LDPC-type decoding. When the signal quality of these codewords degrades below a threshold, erasures are generated as represented by the dark grey sections. In one embodiment, a number of erasures are generated for a codeword that exceeds the correction power of the codeword. That is, a number of symbols may be erased in a codeword such that the codeword is not able to converge during the first iterations of the LDPC-type decoder 50 shown in FIG. 3. However after the first LDPC iterations, the LLRs for the un-converged codeword are updated (improved) using the parity bits of the parity sector. Updating the LLRs using the parity bits of the parity sector increases the likelihood the updated codeword will converge during a subsequent iteration of the LDPC-type decoder 50. Accordingly, a codeword that is initialized with a number of erasures that exceeds the correction power of the codeword may still converge due to the added redundancy of the parity sector.

Any suitable technique may be employed to update the LLRs of a codeword using the parity bits of the parity sector. In general, when processing the LLRs of the codewords corresponding to one of the parity sector parity bits, at least one of the LLRs across the un-converged codewords is modified so that the likelihood of a codeword bit flips its binary state, thereby satisfying the parity of the parity sector. When at least one of the LLRs is updated correctly, it improves the likelihood the corresponding codeword will converge during the subsequent processing by the LDPC-type decoder 50. As each un-converged codeword such as shown in FIG. 4A converges, there is a corresponding improvement in the update accuracy of the parity sector, further improving the likelihood of recovering all of the un-converged codewords. A suitable technique for updating the LLRs of un-converged codewords using a parity sector is disclosed in U.S. Pat. No. 9,632,863 entitled "TRACK ERROR-CORRECTION CODE EXTENSION," the disclosure of which is incorporated herein by reference.

Figure 4B:
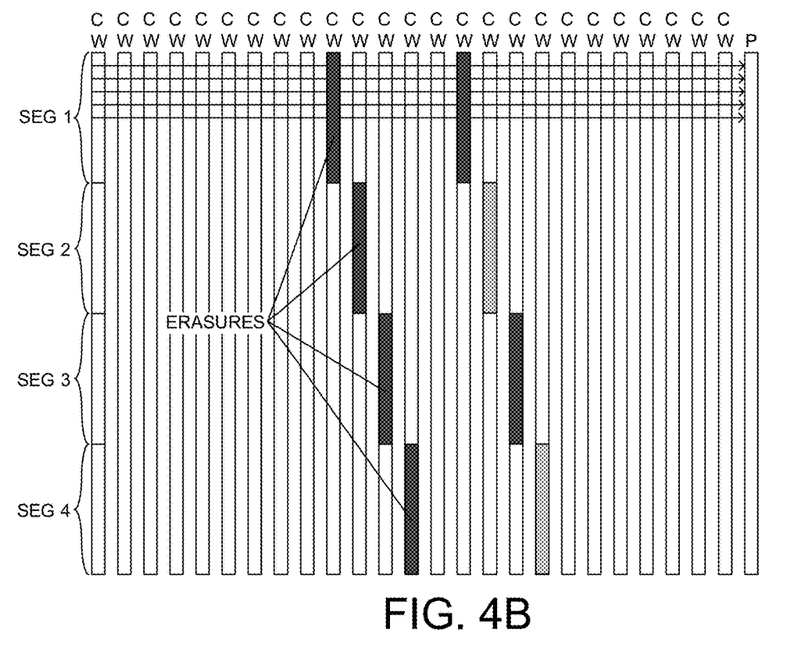
FIG. 4B shows an embodiment wherein a physical block of the NVSM stores interleaved segments from multiple codewords.

In one embodiment, the codewords generated by the LDPC-type encoder 30 of FIG. 3 may be interleaved so that multiple interleaved segments from multiple codewords are written to a physical block of the NVMS 8 (e.g., to a data sector on a disk). FIG. 4B shows an example of this embodiment wherein each of four codewords is divided into four segments which are interleaved such that each physical block (e.g., each data sector) stores a segment from each of the four codewords. In other embodiments, the granularity of the interleaving may involve fewer or more segments from fewer or more codewords. During a read operation, the reliability metrics (e.g., LLRs) output by the SOVA-type detector 42 are de-interleaved into the corresponding codewords prior to being decoded by the LDPC-type decoder 50. This embodiment spreads a low SNR area of the NVSM 8 across multiple codewords to increase the likelihood of recovering data corrupted by anomalies such as a defect in the NVSM 8 or inter-symbol/adjacent-symbol interference (e.g., a track squeeze condition when writing to a disk).

In the example shown in FIG. 4B, a low SNR area of the NVSM 8 renders two of the physical blocks unreadable, or readable with low signal quality, such that at least one segment of the physical block is erased (e.g., the LLR for each symbol in the segment is erased). However, due to the interleaving of the segments across four codewords, each segment is included in a different codeword for LDPC-type decoding which increases the likelihood that the erased segments will be recoverable due to the higher SNR segments remaining in each codeword. In one embodiment, the length of the interleave segment is configured such that when the entire segment is erased, the number of erasures in the codeword exceeds the correction power of the codeword. Referring again to the example of FIG. 4B, each codeword comprises four interleaved segments such that erasing one of the segments results in erasing one-fourth of the codeword. In one embodiment, erasing one-fourth of a codeword exceeds the correction power of the codeword during the initial LDPC-type decoding meaning the codeword will not converge. However, after updating the LLRs using the parity bits of the parity sector as described above (including possible iterations of updating), the codewords can still converge.

In the embodiments described above, a block of codewords may be covered by a single parity sector. In other embodiments, a block of codewords may be covered by multiple parity sectors, for example, by generating a first parity sector over each symbol in a first interleave (e.g., even interleave) of a codeword, and generating a second parity sector over each symbol in a second interleave (e.g., odd interleave) in the codeword. In one embodiment, multiple parity sectors may be generated over different symbol resolutions (e.g., every ½ and every ¼ symbols), and the reliability metrics updated (block 56 of FIG. 3) in a cascading manner starting with the lowest resolution parity sector. Examples of this embodiment are disclosed in U.S. patent application Ser. No. 15/161,165 entitled "DATA STORAGE DEVICE DYNAMICALLY GENERATING EXTENDED REDUNDANCY OVER INTERLEAVES OF A DATA TRACK," the disclosure of which is incorporated herein by reference.

In one embodiment, there are several configurable parameters of the ECC system that determine the likelihood that all codewords in a block of codewords covered by a parity sector will converge. These parameters may include the density (spacing) of the recorded data in the NVSM 8, the code rate of the codewords (i.e., the number of redundancy symbols added to each codeword), the latency (iterations) of the decoder, the threshold for determining when to erase a symbol and the number of adjacent symbols to erase (block 46 of FIG. 3), the number of codewords in the block covered by a parity sector, the length of an interleave segment when interleaving codewords (e.g., as shown in FIG. 4B), the number of parity sectors covering a block of codewords, etc. In one embodiment, a calibration procedure may be executed during manufacturing of the data storage device, and/or while the data storage device is deployed in the field, in order to find the ECC system parameters that provide the best performance in terms of reliability and capacity of the NVSM 8. For example, the calibration procedure may write/read known test patterns to the NVSM 8 using different settings for the various ECC system parameters in order to determine the parameters that provide an acceptable bit error rate performance (which correlates with the likelihood that all of the codewords in a block will converge). The calibration process may involve simulating a low SNR of the NVSM 8, such as by injecting a noise source into the read signal, inducing a track squeeze condition, adjusting a fly height of a head, etc. In one embodiment, the parameters of the ECC system may be calibrated periodically over the life of the data storage device to compensate for changes that may occur over time, such as general degradation of the NVSM 8 (e.g., in NAND memory due to repeated write-erase cycles), or degradation of other components, such as a head in a disk drive.

In one embodiment, the number of erasures that will exceed the correction power of a codeword is based on the number of redundancy symbols encoded into the codeword. For example, in an embodiment where the codewords are encoded using an LDPC code, it may require approximately four symbols of redundancy to correct a single symbol of the codeword without using erasures, and it may require approximately two symbols of redundancy to correct a single symbol of a codeword when using erasures. In this embodiment, when the number of erasures exceeds approximately half the number of redundancy symbols in a codeword, the codeword becomes unrecoverable during the initial iterations of the LDPC-type decoding regardless as to the signal quality of the non-erased symbols. However, in one embodiment erasing more symbols in a codeword helps prevent these marginal symbols from corrupting the LLRs of other symbols having a higher signal quality. Accordingly, even though the codeword will not converge during the initial LDPC-type decoding, the LLRs for the codeword will update more accurately during the initial LDPC-type decoding than if fewer symbols are erased (i.e., if more signal noise were allowed into the initial LDPC-type decoding). Since the LLRs of the codeword are updated more accurately during the initial LDPC-type decoding, the subsequent update using the parity sector becomes more accurate, thereby increasing the likelihood of eventually recovering the codeword.

In one embodiment, the number of erasures generated for a codeword may be limited by a predetermined threshold to ensure the redundancy of the codewords, together with the redundancy of the parity sector, is still able to recover all of the codewords. In one embodiment, the total number of erasures for the block of codewords covered by the parity sector may be limited, such that some codewords may be configured with more erasures than other codewords. In yet another embodiment, the number of erasures that overlap across the codewords may be limited so that there is a limited number of erased symbols per parity bit in the parity sector. This limit may be applied to every parity bit, or the limit may vary per parity bit as long as the overall number of overlapping erasures across all the codewords does not exceed a predetermined threshold.

In one embodiment, the number of erasures (and optionally the number of overlapping erasures) generated per codeword and/or per block of codewords may be adjusted over multiple iterations of the reliability metrics output by the SOVA-type detector 42. For example, in one embodiment the number of erasures may be varied from a minimum number (e.g., zero) up to a predetermined threshold in any suitable increment for each iteration over the output of the SOVA-type detector 42. Any suitable technique may be employed to vary the number of erasures, such as by adjusting a threshold level of the signal quality (e.g., SNR) used to qualify a symbol as an erasure. In one embodiment, the threshold(s) for qualifying erasures may be initially configured (and optionally adjusted over iterative passes) based on a statistical distribution of the signal quality for all the symbols in the block of codewords.

Any suitable LDPC-type encoder/decoder may be employed in the embodiments described above. In general, an LDPC-type decoder uses any suitable form of iterative belief propagation techniques. In addition, the LDPC-type decoder may perform any suitable number of iterations before declaring a codeword converged or un-converged. As described above, the number of iterations may be considered an ECC system parameter that may be calibrated to achieve optimal performance in terms of accuracy and speed.

Any suitable control circuitry may be employed to implement the flow diagrams in the above embodiments, such as any suitable integrated circuit or circuits. For example, the control circuitry may be implemented within a read channel integrated circuit, or in a component separate from the read channel, such as a data storage controller, or certain operations described above may be performed by a read channel and others by a data storage controller. In one embodiment, the read channel and data storage controller are implemented as separate integrated circuits, and in an alternative embodiment they are fabricated into a single integrated circuit or system on a chip (SOC). In addition, the control circuitry may include a suitable preamp circuit implemented as a separate integrated circuit, integrated into the read channel or data storage controller circuit, or integrated into a SOC.

In one embodiment, the control circuitry comprises a microprocessor executing instructions, the instructions being operable to cause the microprocessor to perform the flow diagrams described herein. The instructions may be stored in any computer-readable medium. In one embodiment, they may be stored on a non-volatile semiconductor memory external to the microprocessor, or integrated with the microprocessor in a SOC. In another embodiment, the instructions are stored on the NVSM and read into a volatile semiconductor memory when the data storage device is powered on. In yet another embodiment, the control circuitry comprises suitable logic circuitry, such as state machine circuitry.

In various embodiments, a disk drive may include a magnetic disk drive, an optical disk drive, etc. In addition, while the above examples concern a disk drive, the various embodiments are not limited to a disk drive and can be applied to other data storage devices and systems, such as magnetic tape drives, solid state drives, hybrid drives, etc. In addition, some embodiments may include electronic devices such as computing devices, data server devices, media content storage devices, etc. that comprise the storage media and/or control circuitry as described above.

The various features and processes described above may be used independently of one another, or may be combined in various ways. All possible combinations and subcombinations are intended to fall within the scope of this disclosure. In addition, certain method, event or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other manner. Tasks or events may be added to or removed from the disclosed example embodiments. The example systems and components described herein may be configured differently than described. For example, elements may be added to, removed from, or rearranged compared to the disclosed example embodiments.

While certain example embodiments have been described, these embodiments have been presented by way of example only, and are not intended to limit the scope of the inventions disclosed herein. Thus, nothing in the foregoing description is intended to imply that any particular feature, characteristic, step, module, or block is necessary or indispensable. Indeed, the novel methods and systems described herein may be embodied in a variety of other forms; furthermore, various omissions, substitutions and changes in the form of the methods and systems described herein may be made without departing from the spirit of the embodiments disclosed herein.

What is claimed is:

1. A data storage device comprising:
a non-volatile storage medium (NVSM); and
control circuitry configured to:
generate a plurality of codewords each comprising a plurality of symbols;
generate a parity sector over the plurality of codewords;
write the plurality of codewords and the parity sector to the NVSM;
read the plurality of codewords and the parity sector from the NVSM;
generate a reliability metric for each symbol of each codeword read from the NVSM;
generate a number of erasures for a first codeword read from the NVSM, wherein the number of erasures exceeds the correction power of the first codeword;
modify a reliability metric of the first codeword corresponding to one of the erasures;
first iteratively process the reliability metrics for each codeword including the modified reliability metrics of the first codeword using a low density parity check (LDPC) type decoder, thereby first updating the reliability metric for each symbol of each codeword;
second update the reliability metrics for the first codeword using the parity sector; and
second iteratively process the second updated reliability metrics for the first codeword using the LDPC-type decoder.

2. The data storage device as recited in claim 1, wherein the control circuitry is further configured to:
after second iteratively processing the second reliability metrics for the first codeword, third update the reliability metrics for the first codeword using the parity sector; and
third iteratively process the third updated reliability metrics for the first codeword using the LDPC-type decoder.

3. The data storage device as recited in claim 1, wherein the reliability metric comprises a log-likelihood ratio (LLR).

4. The data storage device as recited in claim 3, wherein the control circuitry is further configured to modify the reliability metric of the first codeword corresponding to one of the erasures by zeroing the LLR.

5. The data storage device as recited in claim 1, wherein the control circuitry is further configured to generate the erasures for the first codeword based on a signal quality of a read signal when reading the first codeword from the NVSM.

6. The data storage device as recited in claim 5, wherein the control circuitry is further configured to generate the erasures for the first codeword based on a signal quality of equalized samples when reading the first codeword from the NVSM.

7. The data storage device as recited in claim 1, wherein the control circuitry is further configured to:
divide each codeword into a number of segments each comprising a plurality of symbols;
interleave the segments from at least the first codeword and a second codeword to generate interleaved segments;
write the interleaved segments to a physical block of the NVSM; and
generate the erasures for the first codeword by generating an erasure for each symbol of one of the segments, wherein the number of symbols in the segment exceeds the correction power of the first codeword.

8. A method of operating a data storage device, the method comprising:
generating a plurality of codewords each comprising a plurality of symbols;
generating a parity sector over the plurality of codewords;
writing the plurality of codewords and the parity sector to a non-volatile storage medium (NVSM);
reading the plurality of codewords and the parity sector from the NVSM;
generating a reliability metric for each symbol of each codeword read from the NVSM;
generating a number of erasures for a first codeword read from the NVSM, wherein the number of erasures exceeds the correction power of the first codeword;
modifying a reliability metric of the first codeword corresponding to one of the erasures;
first iteratively processing the reliability metrics for each codeword including the modified reliability metrics of the first codeword using a low density parity check (LDPC) type decoder, thereby first updating the reliability metric for each symbol of each codeword;

second updating the reliability metrics for the first codeword using the parity sector; and second iteratively processing the second updated reliability metrics for the first codeword using the LDPC-type decoder.

9. The method as recited in claim 8, further comprising:

after second iteratively processing the second reliability metrics for the first codeword, third updating the reliability metrics for the first codeword using the parity sector; and third iteratively processing the third updated reliability metrics for the first codeword using the LDPC-type decoder.

10. The method as recited in claim 8, wherein the reliability metric comprises a log-likelihood ratio (LLR).

11. The method as recited in claim 10, further comprising modifying the reliability metric of the first codeword corresponding to one of the erasures by zeroing the LLR.

12. The method as recited in claim 8, further comprising generating the erasures for the first codeword based on a signal quality of a read signal when reading the first codeword from the NVSM.

13. The method as recited in claim 12, further comprising generating the erasures for the first codeword based on a signal quality of equalized samples when reading the first codeword from the NVSM.

14. The method as recited in claim 8, further comprising:

dividing each codeword into a number of segments each comprising a plurality of symbols;

interleaving the segments from at least the first codeword and a second codeword to generate interleaved segments;

writing the interleaved segments to a physical block of the NVSM; and generating the erasures for the first codeword by generating an erasure for each symbol of one of the segments, wherein the number of symbols in the segment exceeds the correction power of the first codeword.

15. Control circuitry configured to:

generate a plurality of codewords each comprising a plurality of symbols;

generate a parity sector over the plurality of codewords;

write the plurality of codewords and the parity sector to a non-volatile storage medium (NVSM);

read the plurality of codewords and the parity sector from the NVSM;

generate a reliability metric for each symbol of each codeword read from the NVSM;

generate a number of erasures for a first codeword read from the NVSM, wherein the number of erasures exceeds the correction power of the first codeword;

modify a reliability metric of the first codeword corresponding to one of the erasures;

first iteratively process the reliability metrics for each codeword including the modified reliability metrics of the first codeword using a low density parity check (LDPC) type decoder, thereby first updating the reliability metric for each symbol of each codeword;

second update the reliability metrics for the first codeword using the parity sector; and second iteratively process the second updated reliability metrics for the first codeword using the LDPC-type decoder.

16. The control circuitry as recited in claim 15, wherein the control circuitry is further configured to:

after second iteratively processing the second reliability metrics for the first codeword, third update the reliability metrics for the first codeword using the parity sector; and third iteratively process the third updated reliability metrics for the first codeword using the LDPC-type decoder.

17. The control circuitry as recited in claim 15, wherein the reliability metric comprises a log-likelihood ratio (LLR).

18. The control circuitry as recited in claim 17, wherein the control circuitry is further configured to modify the reliability metric of the first codeword corresponding to one of the erasures by zeroing the LLR.

19. The control circuitry as recited in claim 15, wherein the control circuitry is further configured to generate the erasures for the first codeword based on a signal quality of a read signal when reading the first codeword from the NVSM.

20. The control circuitry as recited in claim 19, wherein the control circuitry is further configured to generate the erasures for the first codeword based on a signal quality of equalized samples when reading the first codeword from the NVSM.

21. The control circuitry as recited in claim 15, wherein the control circuitry is further configured to:

divide each codeword into a number of segments each comprising a plurality of symbols;

interleave the segments from at least the first codeword and a second codeword to generate interleaved segments;

write the interleaved segments to a physical block of the NVSM; and generate the erasures for the first codeword by generating an erasure for each symbol of one of the segments, wherein the number of symbols in the segment exceeds the correction power of the first codeword.

* * * * *